United States Patent
Yang

(10) Patent No.: US 8,045,399 B2
(45) Date of Patent: Oct. 25, 2011

(54) DATA OUTPUT CIRCUIT IN A SEMICONDUCTOR MEMORY APPARATUS

(75) Inventor: Jong Yeol Yang, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 282 days.

(21) Appl. No.: 12/410,579

(22) Filed: Mar. 25, 2009

(65) Prior Publication Data

US 2010/0034032 A1 Feb. 11, 2010

(30) Foreign Application Priority Data

Aug. 11, 2008 (KR) .......................... 10-2008-0078394

(51) Int. Cl.
*G11C 7/10* (2006.01)
(52) U.S. Cl. .............. 365/189.05; 365/189.08; 365/194; 365/230.06; 327/396; 327/393; 327/100; 327/404
(58) Field of Classification Search ............. 365/189.11, 365/189.011, 189.15, 189.05, 189.08, 194; 365/230.06; 327/396, 393, 108, 404, 27, 327/87
See application file for complete search history.

(56) References Cited

U.S. PATENT DOCUMENTS

| | | | | | |
|---|---|---|---|---|---|
| 5,850,159 | A | * | 12/1998 | Chow et al. | 327/394 |
| 6,094,086 | A | * | 7/2000 | Chow | 327/396 |
| 6,130,563 | A | * | 10/2000 | Pilling et al. | 327/111 |
| 7,279,933 | B2 | * | 10/2007 | Lee | 326/82 |
| 7,282,968 | B2 | | 10/2007 | Lee | |
| 2004/0251940 | A1 | * | 12/2004 | Hayashi et al. | 327/170 |
| 2005/0083766 | A1 | * | 4/2005 | Kim et al. | 365/230.05 |
| 2007/0182453 | A1 | | 8/2007 | Lee | |
| 2008/0088365 | A1 | | 4/2008 | Jang | |

FOREIGN PATENT DOCUMENTS

JP 2004-327602 11/2004
KR 1020070070989 A 7/2007

* cited by examiner

*Primary Examiner* — Pho M Luu
*Assistant Examiner* — Thao Bui
(74) *Attorney, Agent, or Firm* — IP & T Group LLP

(57) ABSTRACT

A data output circuit in a semiconductor memory apparatus includes a pre-driver configured to receive input data and then produce a pull-up signal and a pull-down signal, a pull-up driver configured to pull-up drive a first node in response to the pull-up signal and provide an additional pull-up drive when a voltage level on the first node transitions, a pull-down driver configured to pull-down drive a second node in response to the pull-down signal and provide an additional pull-down drive when a voltage level on the second node transitions, and a pad coupled to the first and second nodes to generate output data.

21 Claims, 4 Drawing Sheets

DATA OUTPUT CIRCUIT IN A SEMICONDUCTOR MEMORY APPARATUS

CROSS-REFERENCES TO RELATED APPLICATION

The present application claims priority under 35 U.S.C. 119(a) to Korean application number 10-2008-0078394, filed on Aug. 11, 2008, in the Korean Patent Office, which is incorporated by reference in its entirety as if set forth in full.

TECHNICAL FIELD

The embodiments described herein relate to a semiconductor memory apparatus and, more particularly, to a data output circuit in a semiconductor memory apparatus.

RELATED ART

Generally, a semiconductor memory apparatus outputs data to an external circuit using a data output circuit. The data output circuit amplifies the data and then outputs the amplified data to an outside of the semiconductor memory apparatus; however, a stable buffering operation is inevitably required to output the data because the semiconductor memory apparatus is required to operate in a high-speed and low-power consumption.

On the other hand, in the semiconductor memory apparatus, a data amplification strength is being increasingly reduced from a full size strength to a half or quarter size strength in order to reduce current consumption. Therefore, data valid window to output the data is also being increasingly reduced.

FIG. 1 is a schematic circuit diagram illustrating a conventional data output circuit.

Referring to FIG. 1, the conventional data output circuit includes a pre-driving unit 10, a pull-up driver 20, a pull-down driver 30, and a pad 40. The pre-driving unit 10 includes a first pre-driver 11 to produce a pull-up signal 'up_in' and a second pre-driver 12 to produce a pull-down signal 'down_in'. The first and second pre-drivers 11 and 12 receive input data 'Din' and produce the pull-up signal 'up_in' and the pull-down signal 'down_in', which are respectively applied to the pull-up driver 20 and the pull-down driver 30, after amplifying the received signals.

The pull-up driver 20 performs a pull-up operation on a first node A in response to the pull-up signal 'up_in' of the first pre-driver 11 and the pull-down driver 30 performs a pull-down operation on a second node B in response to the pull-down signal 'down_in' of the second pre-driver 12. The pull-up driver 20 including three PMOS transistors P1, P2 and P3, to which an external power supply voltage 'VDDQ' is applied, pull-up drives the first node A. The pull-down driver 30 including three NMOS transistors N1, N2 and N3, to which are connected to a ground voltage terminal 'VSSQ', pull-down drives the second node B.

The pad 40, which receive output signals 'up_out' and 'down_out' on the first and second nodes A and B, provides output data 'Dout' to an external circuit.

The PMOS transistors P1, P2 and P3 in the pull-up driver 20 and the NMOS transistors N1, N2 and N3 in the pull-down driver 30 drive the first and second nodes A and B in response to the pull-up signal 'up_in' and the pull-down signal 'down_in' respectively; however, their driving force is reduced significantly after a predetermined time. That is, the voltage (Vgs) between a gate terminal and a source terminal in each transistor is reduced such that the drivability is also reduced. This is linked directly with the reduction of the valid data window. The valid data window can be increased by increasing the number of the transistors in the pull-up and pull-down drivers; however, this causes another problem in that the upper and lowest limits of the output data can be exceeded.

The reduction of the range in the valid data window may cause a device failure in all the applications. Therefore, it is very important to guarantee the characteristics of a data output circuit which has a stable valid data window.

SUMMARY

A data output circuit capable of increasing a range of a valid data window is described herein.

According to one aspect, a data output circuit in a semiconductor memory apparatus comprises a pre-driving unit configured to receive input data and then produce a pull-up signal and a pull-down signal, a pull-up driving unit configured to pull-up drive a first node in response to the pull-up signal and provide an additional pull-up drive when a voltage level on the first node transitions, a pull-down driving unit configured to pull-down drive a second node in response to the pull-down signal and provide an additional pull-down drive when a voltage level on the second node transitions, and a pad coupled to the first and second nodes to generate output data.

According to another aspect, a data output circuit in a semiconductor memory apparatus comprises a pre-driving unit configured to receive input data and then produce a pull-up signal and a pull-down signal, a first switching unit configured to produce an inverted signal of a voltage level on a first node in response to the pull-up signal, a pull-up driving unit configured to pull-up drive the first node in response to the pull-up signal and additionally pull-up drive the first node in response to an output signal of the first switching unit, a second switching unit configured to produce an inverted signal of a voltage level on a second node in response to the pull-down signal, a pull-down driving unit configured to pull-down drive the second node in response to the pull-down signal and additionally pull-down drive the second node in response to an output signal of the second switching unit, and a pad coupled to the first and second nodes to generate output data.

In the present disclosure, a data output circuit is improved by enlarging the valid data window of output data.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
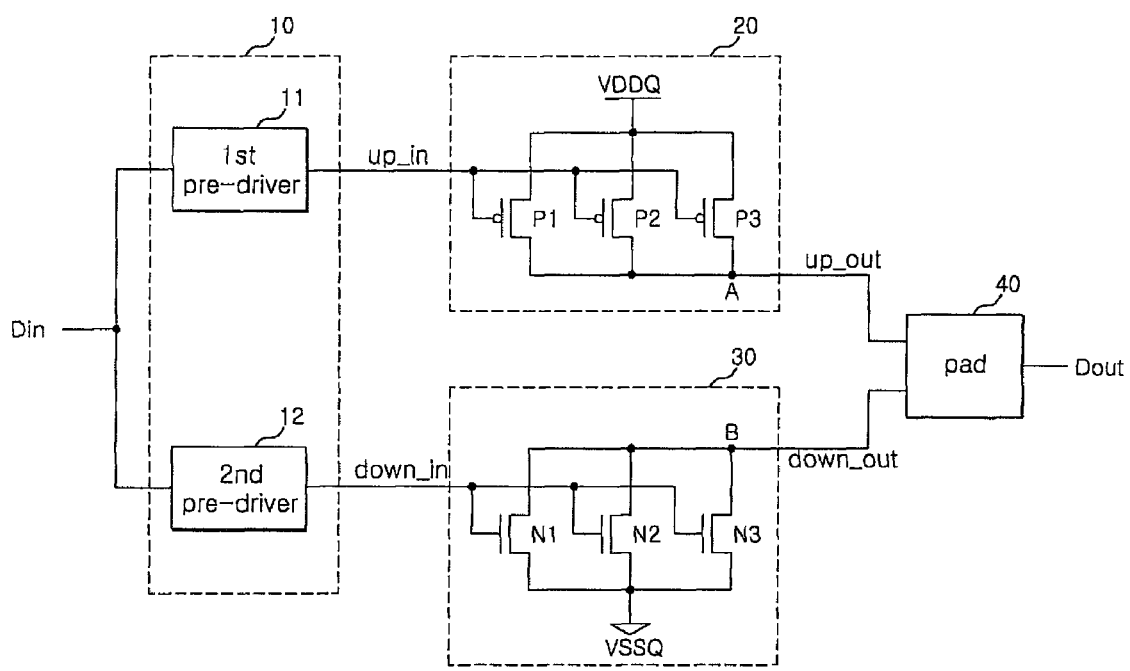
FIG. 1 is a schematic circuit diagram illustrating a conventional data output circuit.
Figure 2:
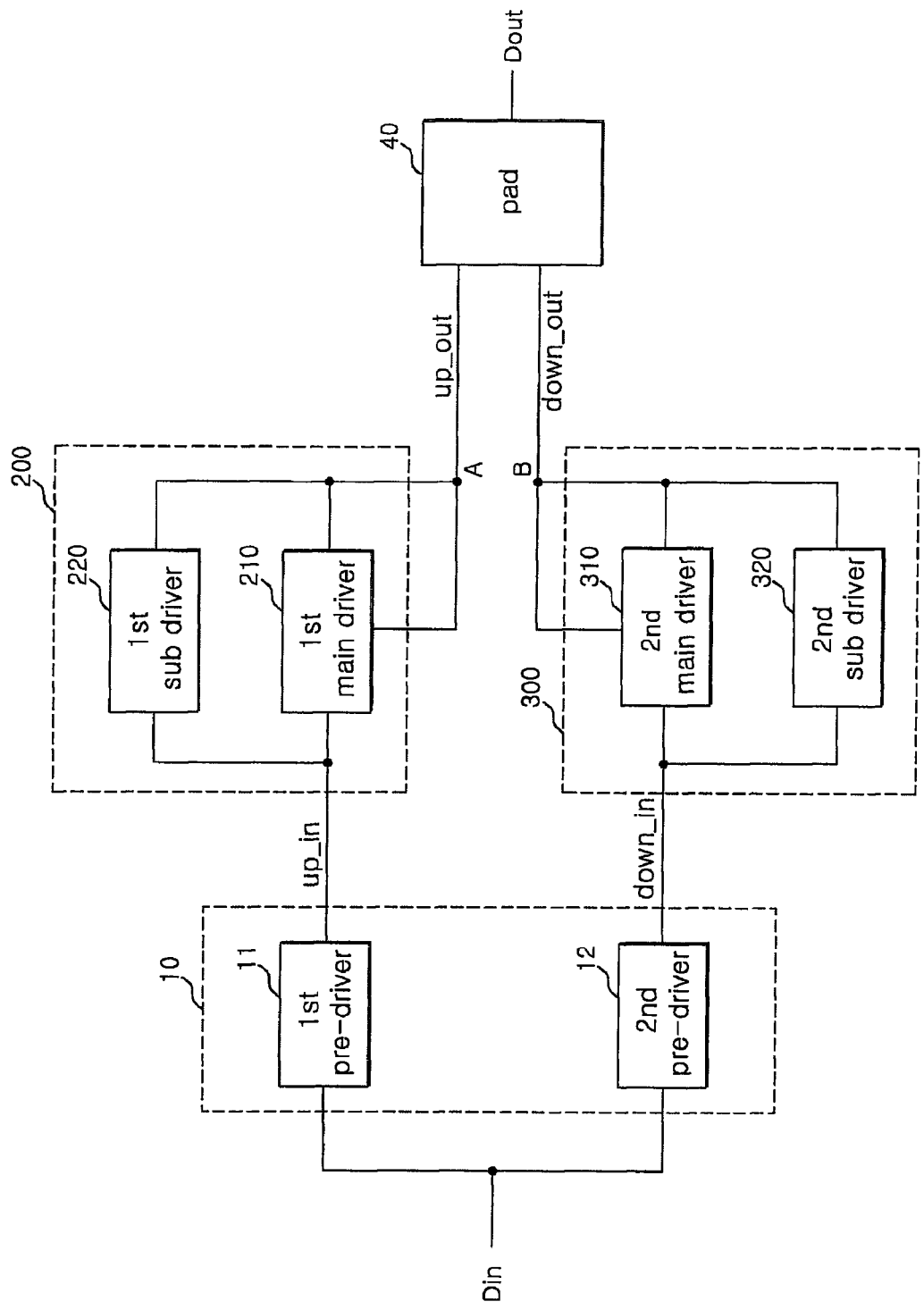
FIG. 2 is a schematic block diagram illustrating an example of a structure of a data output circuit of a semiconductor memory apparatus according to one embodiment.

FIG. 2 is a schematic block diagram illustrating an example of a structure of a data output circuit of a semiconductor memory apparatus according to one embodiment.

Referring to FIG. 2, the data output circuit according to one embodiment can include a pre-driving unit 10, a pull-up driving unit 200, a pull-down driving unit 300, and a pad 40.

The pre-driving unit 10 receives input data 'Din' and then produces a pull-up signal 'up_in' and a pull-down signal 'down_in'. The pre-driving unit 10 can include a first pre-driver 11 to produce the pull-up signal 'up_in' in response to the input data 'Din' and a second pre-driver 12 to produce the pull-down signal 'down_in' in response to the input data 'Din'. The first and second pre-drivers 11 and 12 can be implemented by the conventional pre-drivers. Typically, they can be implemented by a circuit which amplifies the input data 'Din' such as a buffer.

The pull-up driving unit 200 pulls up a voltage level on a first node A in response to the pull-up signal 'up_in' and provides an additional pull-up drive at the time the voltage level on the first node A transitions (e.g., switches). That is, the pull-up driving unit 200 can include a first main driver 210 to pull-up drive the first node A in response to the pull-up signal 'up_in' and further include a first sub driver 220 to additionally pull-up drive the first node A at the time the voltage level on the first node A transitions.

The pull-down driving unit 300 pulls down a voltage level on a second node B in response to the pull-down signal 'down_in' and provides an additional pull-down drive at the time the voltage level on the second node B transitions. That is, the pull-down driving unit 300 can include a second main driver 310 to pull-down drive the second node B in response to the pull-down signal 'down_in' and further include a second sub driver 320 to additionally pull-down drive the second node N at the time the voltage level on the second node A transitions.

The pad 40 is coupled to the first and second nodes A and B and then receives output signals from the first and second nodes A and B. The pad 40 outputs output data 'Dout' to an external circuit by buffering output signals 'up_out' and 'down_out'. The pad 40 can be implemented by conventional pad circuits.

Figure 3:
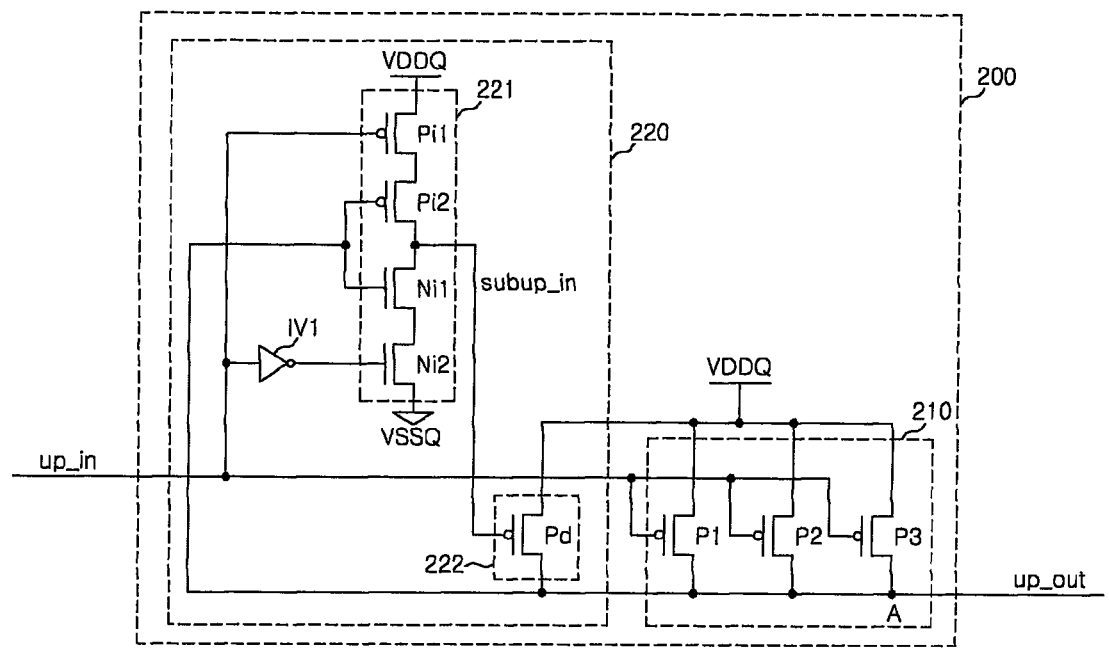
FIG. 3 is a circuit diagram illustrating the data output circuit of FIG. 2.
Figure 3:
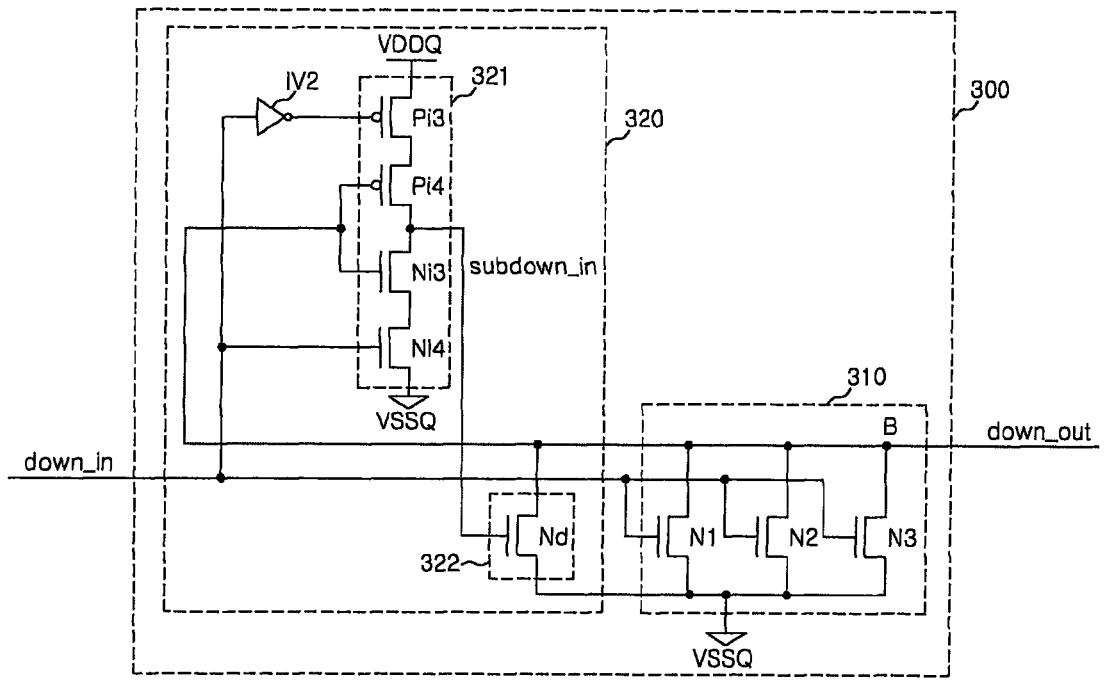

FIG. 3 is a circuit diagram illustrating the pull-up driving unit 200 and the pull-down driving unit 300 of FIG. 2. Referring to FIG. 3, the data output circuit according to one embodiment will be described in detail.

The first main driver 210 can include a plurality of PMOS transistors P1, P2 and P3 each of which has a gate receiving the pull-up signal 'up_in,' a source receiving an external power supply voltage 'VDDQ,', and a drain coupled to the first node A. In one embodiment, the first main driver 210 includes, without being limited to, for example, three transistors P1, P2 and P3.

The first sub driver 220 may include a first switching unit 221 and a first driver 222 in order that the first node A is further pull-up driven at the time the voltage level on the first node A transitions. The first switching unit 221 is turned on/off in response to the pull-up signal 'up_in' and produces, as a first sub driving signal 'subup_in', an inverted signal of the voltage on the first node A. The first driver 222 pull-up drives the first node A in response to the first sub driving signal 'subup_in'.

The first switching unit 221 is turned on/off in response to the pull-up signal 'up_in' and can include a first tri-state inverter to produce, as the first sub driving signal 'subup_in', the inverted signal of the voltage on the first node A. The first tri-state inverter can include two PMOS transistors Pi1 and Pi2 and two NMOS transistors Ni1 and Ni2.

The first driver 222 can include a PMOS transistor Pd having a gate to which the first sub driving signal 'subup_in' is applied, a source to which the external power supply voltage 'VDDQ' is applied, and a drain coupled to the first node A.

The second main driver 310 may include a plurality of NMOS transistors N1, N2 and N3 each of which has a gate receiving the pull-down signal 'down_in,' is applied, a source receiving a ground voltage 'VSSQ,' and a drain coupled to the second node B. In one embodiment, the second main driver 310 includes, without being limited to, for example, three transistors N1, N2 and N3.

The second sub driver 320 can include a second switching unit 321 and a second driver 322 in order that the second node B is further pull-down driven at the time the voltage level on the second node B transitions. The second switching unit 321 is turned on/off in response to the pull-down signal 'down_in' and produces, as a second sub driving signal 'subdown_in', an inverted signal of the voltage on the second node B. The second driver 322 pull-down drives the second node B in response to the second sub driving signal 'subdown_in'.

The second switching unit 321 is turned on/off in response to the pull-up signal 'down_in' and can include a second tri-state inverter to produce, as the second sub driving signal 'subdown_in', the inverted signal of the voltage on the second node B. In similar to the first tri-state inverter, the second tri-state inverter can include two PMOS transistors Pi3 and Pi4 and two NMOS transistors Ni3 and Ni4.

The second driver 322 can include an NMOS transistor Nd having a gate receiving the second sub driving signal 'subdown_in,' a source receiving the ground voltage 'VSSQ' and a drain coupled to the second node B.

The first and second pre-drivers 11 and 12 and the pad 40 can be implemented by conventional pre-drivers and pad circuits, respectively. Accordingly, detailed description will be omitted in the present disclosure.

Referring FIGS. 2 and 3, the operation of the data output circuit according to one embodiment will described below.

First, when the input data 'Din' is in a high level, the first and second pre-drivers 11 and 12 produce the pull-up signal 'up_in' and the pull-down signal 'down_in' of a high level by amplifying the input data 'Din'. Accordingly, the PMOS transistors P1, P2 and P3 in the first main driver 210 are turned off and the NMOS transistors N1, N2 and N3 in the second main driver 310 are turned on. The turn-on NMOS transistors N1, N2 and N3 drive the second node B to the ground voltage level 'VSSQ'. Therefore, the output signal 'down_out' of a low level is gradually produced on the second node B. Meanwhile, the second switching unit 321, which receives the pull-down signal 'down_in' of a high level and an inverted signal via the second inverter IV2 of the pull-down signal 'down_in', is turned on. However, the second switching unit 321 still produces the second sub driving signal 'subdown_in' with a disabled voltage, before the output signal 'down_out' on the second node B transitions to a low level. The second switching unit 321 produces the second sub driving signal 'subdown_in' with an enabled voltage level, at the time the second main driver 310 pull-down drives the second node B and the output signal 'down_out' on the second node B transitions to a low level. Accordingly, the second driver 322, which receives the enable voltage level of the second sub driving signal 'subdown_in', additionally pull-down drives the second node B.

While the NMOS transistors N1, N2 and N3 in the second main driver 310 pull-down drive the second node B in response to the pull-down signal 'down_in', the source voltage of the second main driver 310, i.e., the voltage level of the ground voltage 'VSSQ', is continuously increased. Accordingly, gate to source voltages (Vgs) are continuously decreased in the NMOS transistors N1, N2 and N3 and this causes a drop of the pull-down drive in the NMOS transistors N1, N2 and N3. Therefore, when the drive of the NMOS transistors N1, N2 and N3 is decreased, the second node B additionally pulled down by the second driver 322.

In contrast, when the input data 'Din' are in a low level, the first and second pre-drivers 11 and 12 produce the pull-down signal 'down_in' and the pull-up signal 'up_in' of a low level by amplifying the input data 'Din'. Accordingly, the PMOS transistors P1, P2 and P3 in the first main driver 210 are turned on and the NMOS transistors N1, N2 and N3 in the second main driver 310 are turned off. The turned-on PMOS transistors P1, P2 and P3 drive the first node A up to the external power supply voltage 'VDDQ'. Therefore, the output signal 'up_out' of a high level is gradually produced at the first node A. Meanwhile, the first switching unit 221, which receives the pull-up signal 'up_in' of a low level and an inverted signal via the first inverter IV1 of the pull-up signal 'up_in', is turned on. However, the first switching unit 221 still produces the first sub driving signal 'subup_in' with a disabled voltage level before the output signal 'up_out' on the first node A transitions to a high level. The first switching unit 221 produces the first sub driving signal 'subup_in' with an enabled voltage level at the time the first main driver 210 pull-up drives the first node A and the output signal 'up_out' on the first node A transitions to a high level. Accordingly, the first driver 222, which receives the enabled voltage level of the first sub driving signal 'subup_in', additionally pull-up drives the first node A.

While the PMOS transistors P1, P2 and P3 in the first main driver 210 pull-up drive the first node A in response to the pull-up signal 'up_in', the source voltage of the first main driver 210, i.e., the voltage level of the external power supply voltage 'VDDQ', is continuously decreased. Accordingly, gate to source voltages (Vgs) are continuously decreased in the PMOS transistors P1, P2 and P3 and this causes a drop of the pull-up drive in the PMOS transistors P1, P2 and P3. Therefore, when the drive of the PMOS transistors P1, P2 and P3 is decreased, the first node A is additionally pull-up driven by the first driver 222.

Figure 4:
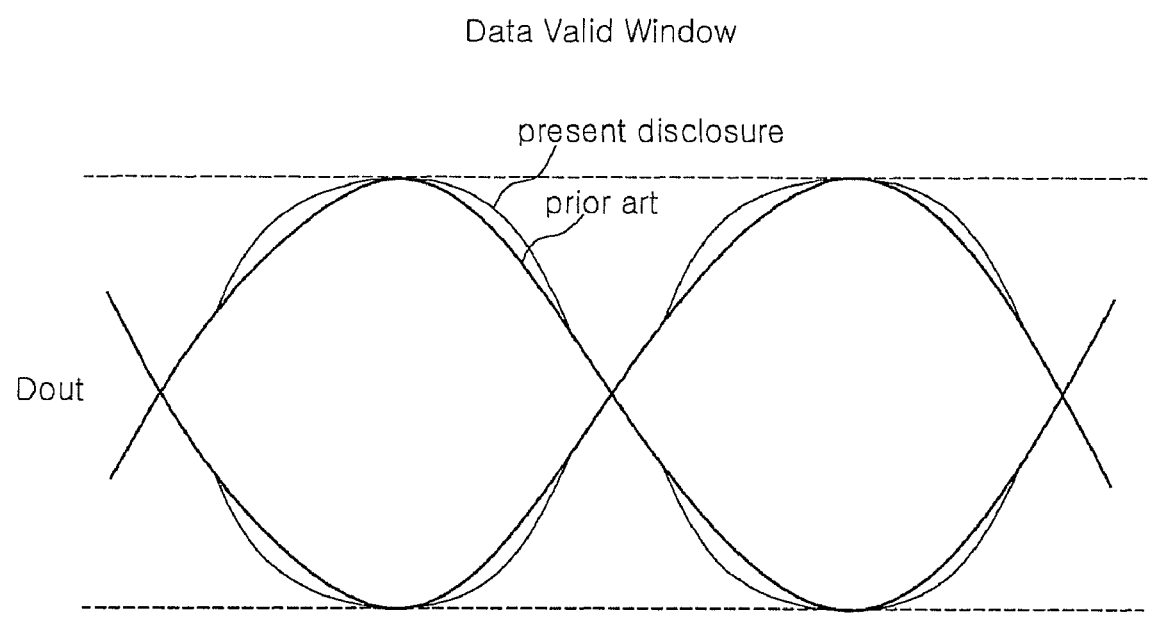
FIG. 4 is a view showing a comparison of two ranges of valid data windows of output data according to the prior art and the present disclosure.

FIG. 4 is a view showing a comparison of two ranges of valid data windows of output data according to the prior art and the present disclosure.

The data output circuit according to the present disclosure includes the first and second sub drivers 222 and 322 and then provides the additional pull-up drive and pull-down drive when the gate to source voltage (Vgs) is decreased at the transistors P1 to P3 and N1 to N3 in the first and second main drivers 210 and 310, thereby increasing the valid data window. As shown in FIG. 4, the valid data window according to the present disclosure is wider than that according to the prior art.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A data output circuit in a semiconductor memory apparatus comprising:
   a pre-driving unit configured to produce a pull-up signal and a pull-down signal in response to input data;
   a pull-up driving unit configured to pull-up drive a first node in response to the pull-up signal and provide an additional pull-up drive when a voltage level of the first node transitions;
   a pull-down driving unit configured to pull-down drive a second node in response to the pull-down signal and provide an additional pull-down drive when a voltage level of the second node transitions; and
   a pad coupled to the first and second nodes to generate output data,
   wherein
      the pull-up driving unit includes a first main driver configured to pull-up drive the first node in response to the pull-up signal and a first sub driver configured to pull-up drive the first node when the voltage level of the first node transitions,
      the first sub driver includes a first switching unit configured to produce a first sub driving signal in response to the pull-up signal and a first driver configured to pull-up drive the first node in response to the first sub driving signal, and
      the first switching unit includes a first tri-state inverter which is configured to produce the first sub driving signal using an inverted signal of the voltage level on the first node.

2. The data output circuit of claim 1, wherein the first main driver includes a plurality of PMOS transistors, each of which has a gate receiving the pull-up signal, a source receiving an external power supply voltage, and a drain coupled to the first node.

3. The data output circuit of claim 1, wherein the first driver includes a first PMOS transistor having a gate receiving the first sub driving signal, a source receiving an external power supply voltage, and a drain coupled to the first node.

4. The data output circuit of claim 1, wherein the pull-down driving unit includes:
   a second main driver configured to pull-down drive the second node in response to the pull-down signal; and
   a second sub driver configured to pull-down drive the second node when the voltage level of the second node transitions.

5. The data output circuit of claim 4, wherein the second main driver includes a plurality of NMOS transistors each of which has a gate receiving the pull-down signal, a source receiving a ground voltage, and a drain coupled to the second node.

6. The data output circuit of claim 4, wherein the second sub driver includes:
   a second switching unit configured to produce a second sub driving signal in response to the pull-down signal; and
   a second driver configured to pull-down drive the second node in response to the second sub driving signal.

7. The data output circuit of claim 6, wherein the second switching unit includes a second tri-state inverter which is configured to produce the second sub driving signal using an inverted signal of the voltage level on the second node.

8. The data output circuit of claim 6, wherein the second driver includes a first NMOS transistor having a gate receiving the second sub driving signal, a source receiving a ground voltage, and a drain coupled to the second node.

9. The data output circuit of claim 1, wherein the pre-driving unit includes:
a first pre-driver configured to produce the pull-up signal in response to the input data; and
a second pre-driver configured to produce the pull-down signal in response to the input data.

10. A data output circuit in a semiconductor memory apparatus comprising:
a pre-driving unit configured to produce a pull-up signal and a pull-down signal in response to input data;
a first switching unit configured to produce an inverted signal of a voltage level on a first node in response to the pull-up signal;
a pull-up driving unit configured to pull-up drive the first node in response to the pull-up signal and additionally pull-up drive the first node in response to an output signal of the first switching unit;
a second switching unit configured to produce an inverted signal of a voltage level on a second node in response to the pull-down signal;
a pull-down driving unit configured to pull-down drive the second node in response to the pull-down signal and additionally pull-down drive the second node in response to an output signal of the second switching unit; and
a pad coupled to the first and second nodes to generate output data.

11. The data output circuit of claim 10, wherein the first switching unit includes a first tri-state inverter which is turned on by the pull-up signal.

12. The data output circuit of claim 10, wherein the second switching unit includes a second tri-state inverter which is turned on by the pull-down signal.

13. The data output circuit of claim 10, wherein the pull-up driving unit includes:
a first main driver configured to pull-up drive the first node in response to the pull-up signal; and
a first sub driver configured to pull-up drive the first node in response to the output signal of the first switching unit.

14. The data output circuit of claim 13, wherein the first main driver includes a plurality of PMOS transistors each of which has a gate receiving the pull-up signal, a source receiving an external power supply voltage, and a drain coupled to the first node.

15. The data output circuit of claim 13, wherein the first sub driver includes a PMOS transistor having a gate receiving the output signal of the first switching unit, a source receiving an external power supply voltage, and a drain coupled to the first node.

16. The data output circuit of claim 10, wherein the pull-down driving unit includes:
a second main driver configured to pull-down drive the second node in response to the pull-down signal; and
a second sub driver configured to pull-down drive the second node in response to the output signal of the second switching unit.

17. The data output circuit of claim 16, wherein the second main driver includes a plurality of NMOS transistors each of which has a gate receiving the pull-down signal, a source receiving a ground voltage, and a drain coupled to the second node.

18. The data output circuit of claim 16, wherein the second sub driver includes an NMOS transistor having a gate receiving the output signal of the second switching unit, a source receiving a ground voltage, and a drain coupled to the second node.

19. The data output circuit of claim 10, wherein the pre-driving unit includes:
a first pre-driver configured to produce the pull-up signal in response to the input data; and
a second pre-driver configured to produce the pull-down signal in response to the input data.

20. A data output circuit in a semiconductor memory apparatus comprising:
a pre-driving unit configured to generate a pull-up signal in response to input data;
a main driver configured to pull-up drive an output node in response to the pull-up signal;
a tri-state inverter configured to generate a sub driving signal in response to a voltage level of the output node when the tri-state inverter is activated by the pull-up signal; and
a sub driver configured to pull-up drive the output node in response to the sub driving signal.

21. A data output circuit in a semiconductor memory apparatus comprising:
a pre-driving unit configured to generate a pull-down signal in response to input data;
a main driver configured to pull-down drive an output node in response to the pull-down signal;
a tri-state inverter configured to generate a sub driving signal in response to a voltage level of the output node when the tri-state inverter is activated by the pull-down signal; and
a sub driver configured to pull-down drive the output node in response to the sub driving signal.

* * * * *